US012650632B2

(12) United States Patent
Knobloch et al.

(10) Patent No.: US 12,650,632 B2
(45) Date of Patent: Jun. 9, 2026

(54) OPTICALLY BASED ANALOG-DIGITAL CONVERTER

(71) Applicant: UNIVERSITÄT PADERBORN, Paderborn (DE)

(72) Inventors: Christine Knobloch, Paderborn (DE); Benjamin Brecht, Paderborn (DE); Stephan Kruse, Paderborn (DE)

(73) Assignee: UNIVERSITÄT PADERBORN, Paderborn (DE)

( * ) Notice: Subject to any disclaimer, the term of this patent is extended or adjusted under 35 U.S.C. 154(b) by 0 days.

(21) Appl. No.: 18/896,535

(22) Filed: Sep. 25, 2024

(65) Prior Publication Data

US 2025/0110383 A1 Apr. 3, 2025

(30) Foreign Application Priority Data

Sep. 29, 2023 (DE) .......................... 102023209622.6

(51) Int. Cl.
| | |
|---|---|
| *H03M 1/00* | (2006.01) |
| *G02F 1/35* | (2006.01) |
| *G02F 7/00* | (2006.01) |
| *H03M 1/08* | (2006.01) |
| *H03M 7/00* | (2006.01) |

(52) U.S. Cl.
CPC .............. *G02F 7/00* (2013.01); *G02F 1/3503* (2021.01); *G02F 1/3507* (2021.01); *H03M 1/0827* (2013.01); *H03M 7/008* (2013.01)

(58) Field of Classification Search
CPC ........ G02F 7/00; G02F 1/3503; G02F 1/3507; H03M 1/0827; H03M 7/008
USPC .......................................................... 341/137
See application file for complete search history.

(56) References Cited

U.S. PATENT DOCUMENTS

| | | | | |
|---|---|---|---|---|
| 10,833,772 B1 | 11/2020 | Chen | | |
| 2010/0040382 A1* | 2/2010 | Romagnoli | .......... | H04B 10/504 |
| | | | | 398/187 |
| 2022/0149949 A1 | 5/2022 | Suo et al. | | |

OTHER PUBLICATIONS

Eckstein et al., "A Quantum Pulse Gate Based On Spectrally Engineered Sum Frequency Generation", Jul. 5-Jul. 18, 2011/vol. 19 , No. 15; Optics Express 13772. (Year: 2011).*

(Continued)

*Primary Examiner* — Jean B Jeanglaude
(74) *Attorney, Agent, or Firm* — Sheridan Ross P.C.

(57) ABSTRACT

An optically-based analogue-to-digital converter includes a first combiner with a first input for an optical reference signal, and a second input for an input signal that is to be digitised, a second combiner with a first input for a pulsed laser signal, and a second input, which is connected to the output of the first combiner, and an evaluation unit, which evaluates the output signal of the second combiner.

19 Claims, 6 Drawing Sheets

(56)           References Cited

OTHER PUBLICATIONS

García et al., "Photonic-Assisted Analog-to-Digital Conversion Based on a Dispersion-Diversity Multicore Fiber," IEEE Journal of Selected Topics in Quantum Electronics, vol. 29, No. 6, Nov. 2023, 8 pages.

Homulle et al., "A Cryogenic 1 GSa/s, Soft-Core FPGA ADC for Quantum Computing Applications," IEEE Transactions on Circuits and Systems-I: Regular Papers, vol. 63, No. 11, Nov. 2016, pp. 1854-1865.

Huang et al., "A Cryogenic 8-Bit 32 MS/s SAR ADC Operating down to 4.2 K," Electronics, vol. 12, No. 6, Mar. 16, 2023, 16 pages.

Zazzi et al., "Optically Enabled ADCs and Application to Optical Communications," IEEE Open Journal of the Solid-State Circuits Society, vol. 1, Dec. 2021, pp. 209-221.

Official Action for Germany Patent Application No. 102023209622.6, dated Sep. 16, 2024, 10 pages.

\* cited by examiner

1

OPTICALLY BASED ANALOG-DIGITAL CONVERTER

CROSS-REFERENCE TO RELATED APPLICATION

This application claims the benefit of German Patent Application No. 10 2023 209 622.6 filed Sep. 29, 2023, the entire contents of which are incorporated herein by reference in its entirety.

TECHNICAL FIELD

The invention relates to an optically-based analogue-to-digital converter.

BACKGROUND

In many sectors, data is recorded using analogue sensors and transformed into a digital format for processing. So-called analogue-to-digital converters (abbreviated as ADCs), sometimes also referred to as analogue-to-digital transformers, are used for this purpose.

One problem with previous analogue-to-digital converters is the internal noise. Furthermore, with previous analogue-to-digital converters, the resolution accuracy of the signal is limited by the maximum number of effective bits (ENOBs), due to the internal distortion of the desired signal.

In the past, there have been attempts to counter these problems.

For example, in the article "Photonic-Assisted Analogue-to-Digital Conversion Based on a Dispersion-Diversity Multicore Fiber" by the authors S. Garcia, M. Ureña and I. Gasulla, published in IEEE Journal of Selected Topics in Quantum Electronics, vol. 29, no. 6: Photonic Signal Processing, pp. 1-8, November-December 2023, the concept of a photonic-assisted ADU is shown, whose optical input signal was split into differently delayed paths using true time delay lines (TTDL), and these were then detected using photodiodes.

Furthermore, from the article "Optically Enabled ADCs and Application to Optical Communications" by the authors A. Zazzi published in IEEE Open Journal of the Solid-State Circuits Society, vol. 1, pp. 209-221, 2021, a photonically assisted electronic track & hold ADU is of known art, whose clock signal was provided by the manipulation of a pulsed laser signal.

Likewise, from the article "A Cryogenic 1 GSa/s, Soft-Core FPGA ADC for Quantum Computing Applications" by the authors H. Homulle, S. Visser and E. Charbon, published in IEEE Transactions on Circuits and Systems I: Regular Papers, vol. 63, no. 11, pp. 1854-1865 November 2016, an ADU concept for quantum applications is of known art, in which the ADU is implemented in a Field Programmable Gate Array (FPGA) and the latter must be cooled down to cryogenic temperatures.

Furthermore, from the article "A Cryogenic 8-Bit 32 MS/s SAR ADC Operating down to 4.2 K" by the authors Y. Huang, C. Luo, and G. Guo, published in Electronics, Vol. 12, No. 6, an electronic ADU for quantum applications is of known art, which likewise has to be cooled down to cryogenic temperatures.

Although the approaches of known art represent an improvement, they are not able to solve the problems (internal noise as well as internal distortion) in a sustainable and cost-effective way, with the result that the resolution accuracy of the analogue signal remains limited.

SUMMARY

Emanating from this situation, it is the object of the invention to provide an optically-based analogue-to-digital converter that makes it possible to digitise any analogue signals with high resolution accuracy, low distortion and low internal noise.

The object is achieved by an optically-based analogue-to-digital converter in accordance with Claim 1. Further advantageous configurations are in particular the subject matter of the dependent claims.

BRIEF DESCRIPTION OF THE DRAWINGS

The invention is explained in more detail below with reference to the figures. In these.

DETAILED DESCRIPTION

In what follows, the invention will be described in more detail with reference to the figures. It should be noted that different aspects are described, each of which can be used individually or in combination. In other words, each aspect can be used with different forms of embodiment of the invention, unless explicitly shown as a pure alternative.

Furthermore, in what follows, for the sake of simplicity, reference will generally only be made to one entity. Unless explicitly stated, however, the invention may also comprise a plurality of the entities concerned. In this respect, the use of the word "one" is only to be understood as an indication that at least one entity is used in a simple form of embodiment.

Insofar as methods are described in what follows, the individual steps of a method can be arranged and/or combined in any order, unless the context explicitly indicates otherwise. Furthermore, the methods can be combined with each other, unless expressly indicated otherwise.

Data with numerical values are generally not to be understood as exact values, but also include a tolerance from +/−1% up to +/−10%.

References to standards or specifications are to be understood as references to standards or specifications in force at the time of the application and/or—if priority is claimed—at the time of the priority application. However, this is not to be understood as a general exclusion of applicability to subsequent or superseding standards or specifications.

FIGS. 1-6 show exemplary forms of embodiment of the invention.

In forms of embodiment of the invention, an optically-based analogue-to-digital converter 1 is provided.

Figure 1:
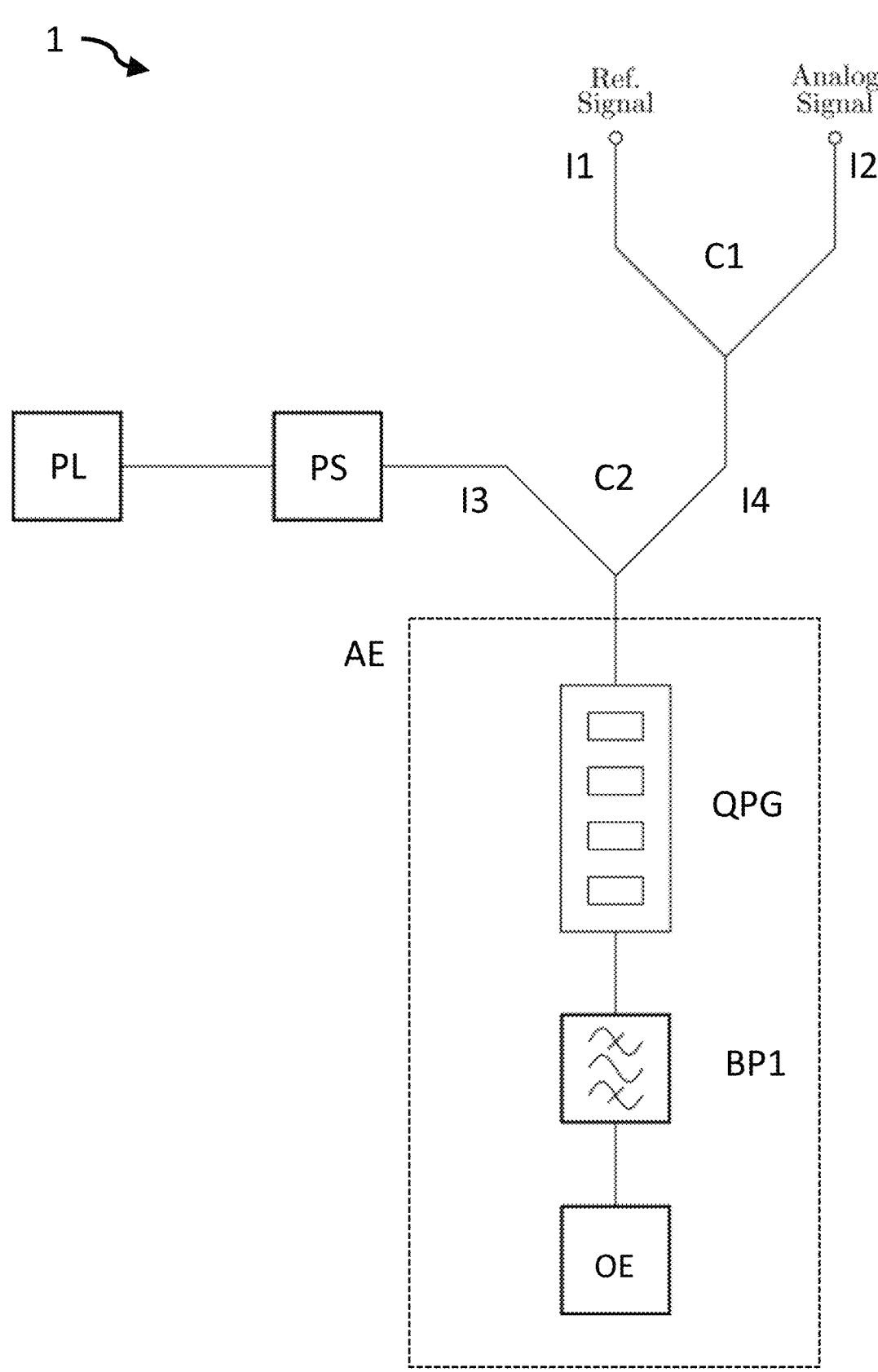
FIG. 1 shows schematically the basic principle of the quantum-assisted ADU in accordance with forms of embodiment of the invention.

The basic principle of the invention is shown in FIG. 1, and operates in accordance with the principle from the article "Achieving the Ultimate Quantum Timing Resolution" by the authors Vahid Ansari, Benjamin Brecht, Jano Gil-Lopez, John M. Donohue, Jaroslav Rehacek, Zdenek Hradil, Luis L. Sánchez-Soto, and Christine Silberhorn, published in 2021-01 PRX Quantum, Vol. 2 American Physical Society p. 010301.

The optically-based analogue-to-digital converter 1 in accordance with the invention has a first combiner C1 with a first input I1 for an optical reference signal (Ref), and a second input I2 for an input signal (Analogue) that is to be digitised.

Furthermore, the optically-based analogue-to-digital converter 1 in accordance with the invention has a second combiner C2 with a first input I3 for a pulsed laser signal, and a second input 14, which is connected to the output of the first combiner C1.

In addition, the inventive optically-based analogue-to-digital converter 1 has an evaluation unit AE, which evaluates the output signal of the second combiner C2.

In the invention, two optical signals, the reference signal (Ref) and the analogue signal (that is to be digitised) are superposed in the first combiner C1 while operation is in progress. Here the amplitude of the reference signal is known.

This superposition of the two input signals is fed into an evaluation unit AE, together with a shaped pulse. The output signal of the evaluation unit AE can then be used to draw conclusions concerning the differences in intensity.

The value of the analogue signal can be determined by evaluating the measured signal and the reference signal, which is already known.

The pulsed laser signal can be used to provide a clock for temporal quantisation.

Figure 2:
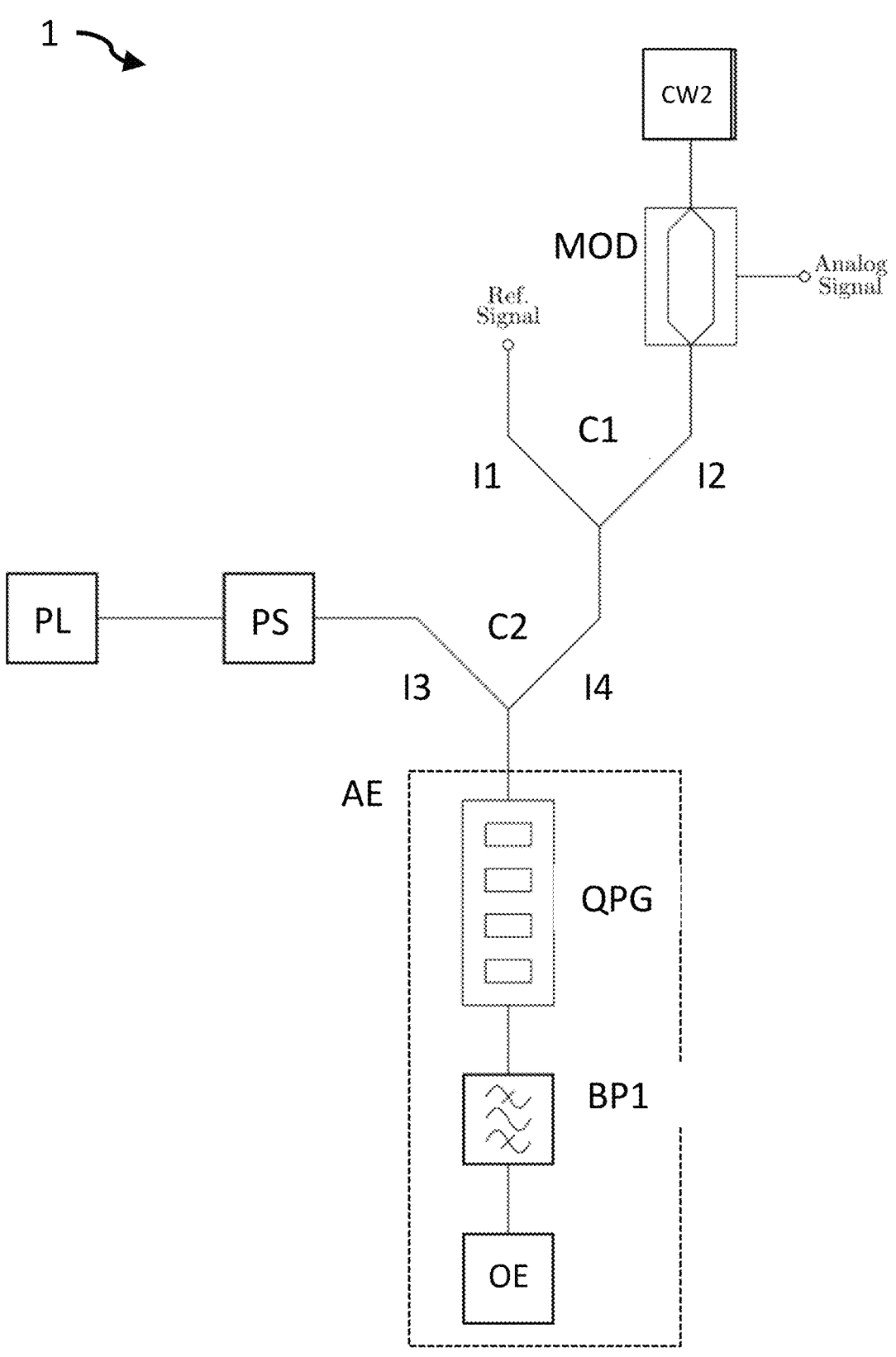
FIG. 2 shows schematically the basic principle of the quantum-assisted ADU in accordance with forms of embodiment of the invention for an electrical input signal.
Figure 3:
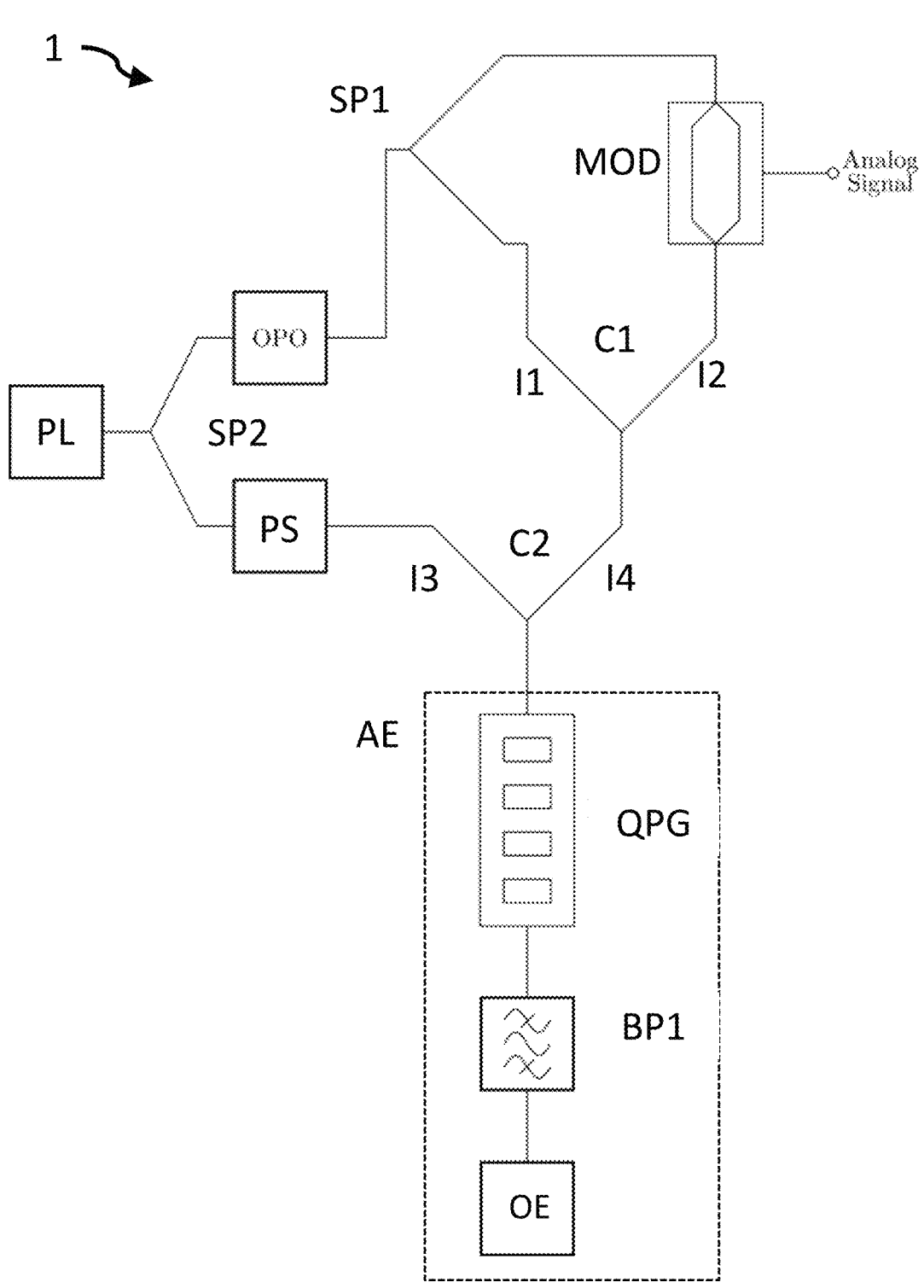
FIG. 3 shows schematically the basic principle of the quantum-assisted ADU in accordance with forms of embodiment of the invention, in which the reference signal is generated on the basis of the pulsed laser signal.
Figure 6:
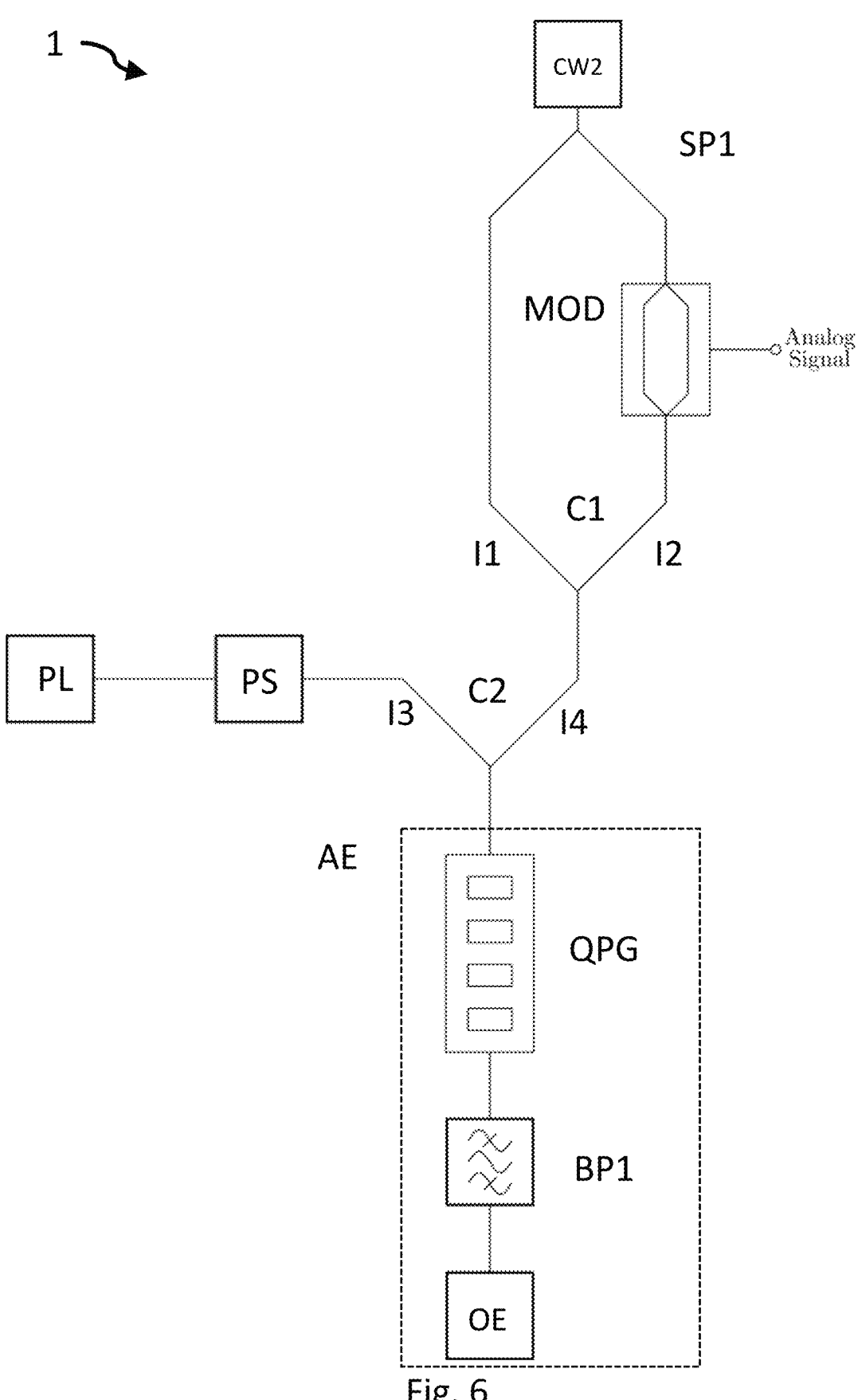
FIG. 6 shows schematically the basic principle of the quantum-assisted ADU in accordance with forms of embodiment of the invention for an electrical input signal. Here, the input signal of the OE modulator and the reference signal originate from the same source.

In forms of embodiment of the invention, see for example FIG. 2, 3 or 6, an optical modulator MOD is arranged ahead of the input for the input signal that is to be digitised; the modulator modulates an optical input signal by means of the input signal that is to be digitised.

In one form of embodiment of the invention, an electro-optical modulator MOD is arranged ahead of the input I2 for the input signal that is to be digitised; the modulator modulates an optical input signal by means of the input signal that is to be digitised, wherein the input signal that is to be digitised is an electrical signal.

That is to say, if the analogue signal that is to be digitised is present as an electrical signal, the electrical signal can be converted into an optical signal using the optical modulator MOD. The design of the optical modulator can be selected in an appropriate manner by a person skilled in the art.

In the form of embodiment in accordance with FIG. 3, a first splitter SP1 is arranged ahead of the electro-optical modulator MOD; the splitter splits an optical input signal, wherein a first part of the optical input signal is made available to the electro-optical modulator MOD while operation is in progress, and a second part of the optical input signal is fed to the first input I1 of the first combiner C1 as the reference signal Ref while operation is in progress.

Figure 4:
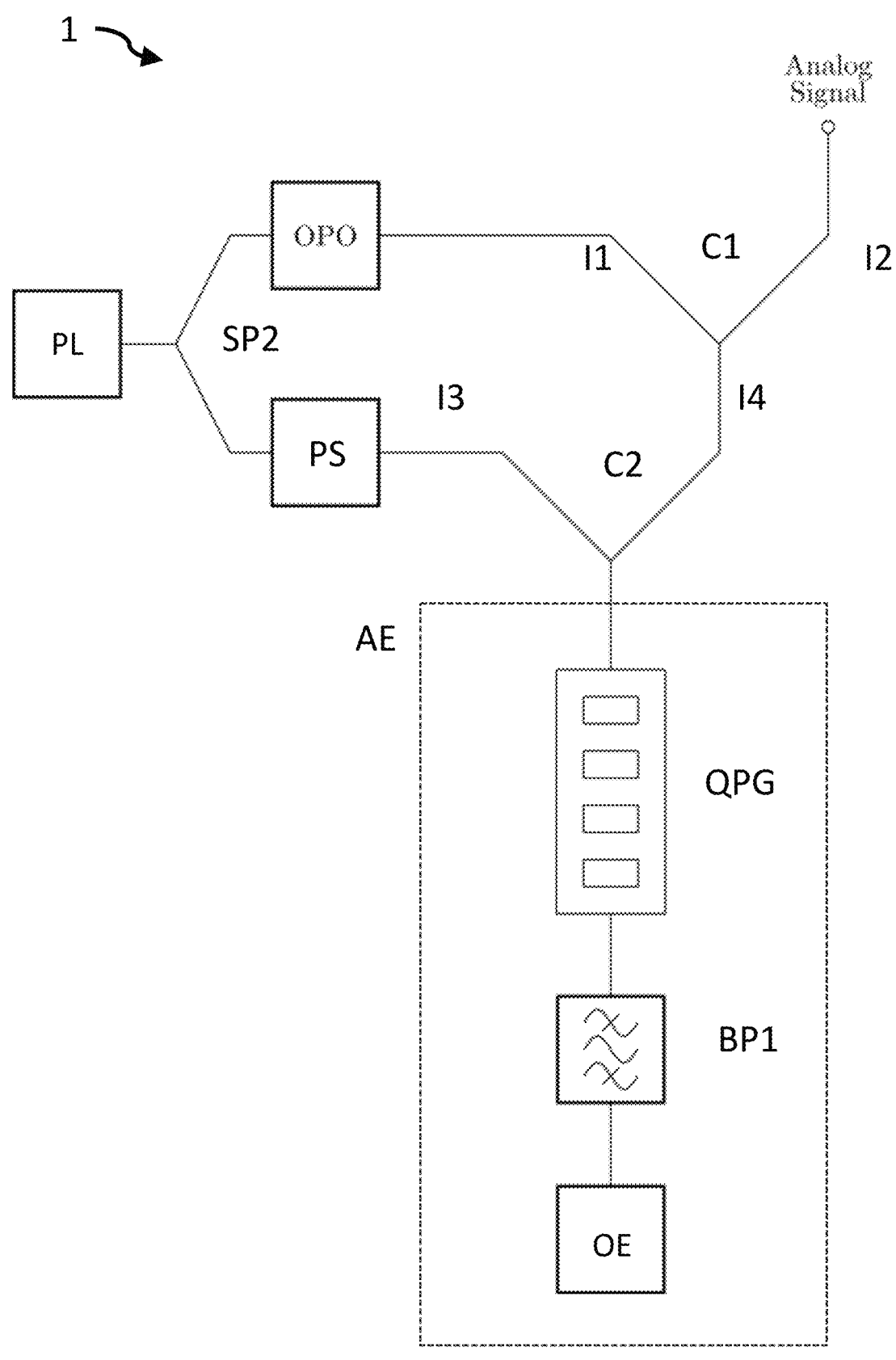
FIG. 4 shows schematically the basic principle of the quantum-assisted ADU in accordance with forms of embodiment of the invention for an electrical input signal, wherein both the reference signal and the input signal of the EO converter can be generated by means of OPO using the pulsed laser signal.
Figure 5:
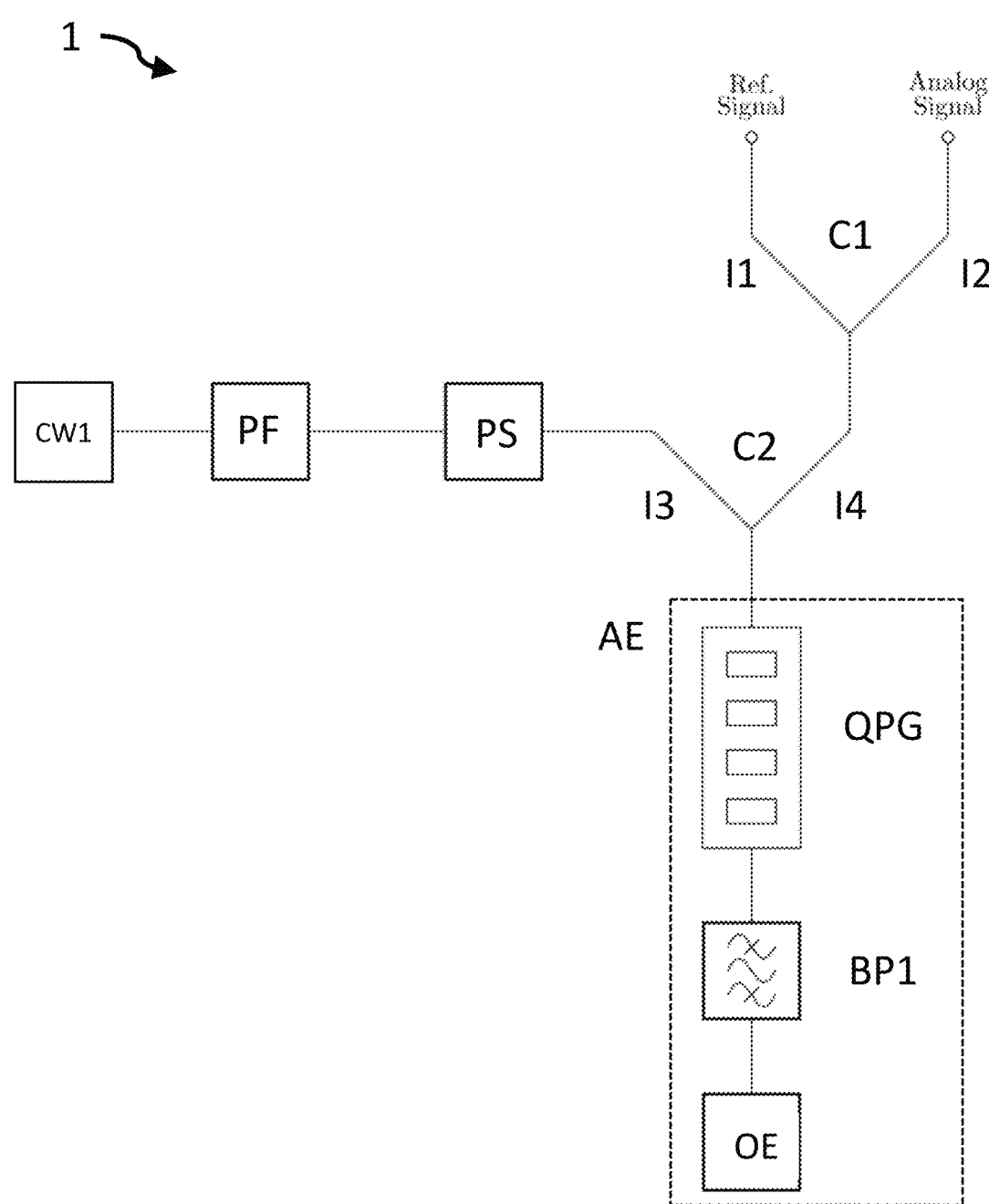
FIG. 5 shows schematically the basic principle of the quantum-assisted ADU in accordance with forms of embodiment of the invention with CW laser and pulse-forming element.

In one form of embodiment of the invention—see FIGS. 3 and 4—the reference signal can also be generated by means of an optical parametric oscillator OPO based on the pulsed laser signal of the source PL. In one form of embodiment, both the reference signal and the input signal of the EO modulator MOD can be generated by means of an optical parametric oscillator OPO based on the pulsed laser signal PL.

In accordance with a further form of embodiment of the invention, an RF laser is arranged ahead of the input I2 for the input signal that is to be digitised; the laser is controlled by means of the input signal that is to be digitised, wherein the input signal that is to be digitised is an electrical signal.

That is to say, it is also possible to convert an analogue electrical signal that is to be digitised directly into an optical signal using an RF laser.

In accordance with yet another form of embodiment of the invention—see FIG. 2—the optical reference signal Ref can also be provided by a second CW laser CW2.

In one form of embodiment of the invention—see figures—a pulse shaper PS can be arranged ahead of the input I3 for the pulsed laser signal.

In yet another form of embodiment of the invention, the input signal for the pulse shaper PS is provided by a pulsed laser PL—see FIGS. 1-4 and 6—or by a first CW laser CW1 followed by a pulse shaper PF—see FIG. 6.

In accordance with a further form of embodiment of the invention, a second splitter SP2 is arranged directly ahead of the pulse shaper PS—see FIGS. 3 and 4—wherein a first part of the optical input signal from the second splitter SP2 is made available to the pulse shaper PS while operation is in progress, and a second part of the optical input signal is fed to the first input I1 of the first combiner C1 as a reference signal Ref via an optical parametric oscillator OPO while operation is in progress.

In accordance with yet another form of embodiment of the invention, the evaluation unit AE has a quantum pulse gate QPG. In particular, the quantum pulse gate QPG can also be a multi-output quantum pulse gate.

Similarly, in one form of embodiment of the invention, the quantum pulse gate QPG can be provided with a polarised non-linear waveguide. The polarisation can be both periodic and aperiodic.

In a further form of embodiment of the invention, the quantum pulse gate QPG has a periodically polarised lithium niobate waveguide, or a polarised potassium titanyl phosphate waveguide. The polarisation can be both periodic and aperiodic.

Furthermore, in one form of embodiment of the invention, provision can be made for the evaluation unit Ae to comprise at least one optoelectronic conversion unit OE, e.g. a photodiode or a phototransistor.

In a further form of embodiment of the invention, the evaluation unit AE further comprises a first optical bandpass filter BP1.

In accordance with yet another embodiment, the optically-based analogue-to-digital converter 1 is fully integrated, or partially integrated, or designed with discrete components.

The invention provides an analogue-to-digital converter that makes it possible to digitise any analogue optical and electrical signals with high resolution accuracy, low distortion and low internal noise.

The inventive analogue-to-digital converter is limited in its resolution accuracy solely by the quantum noise. This means that the disadvantages of the current state of the art in terms of resolution accuracy can be overcome. In addition, the ADU can also be used for quantum applications without the need to be cooled down to cryogenic temperatures.

The invention claimed is:

1. An optically-based analogue-to-digital converter comprising:

a first combiner with a first input for an optical reference signal, and a second input for an input signal that is to be digitised;

a second combiner with a first input for a pulsed laser signal, and a second input connected to an output of the first combiner; and a quantum pulse gate connected to an output of the second combiner and including an output that outputs at least one optical signal to at least one optoelectronic converter for conversion into at least one analog signal which is in turn converted into at least one digital signal.

2. The optically-based analogue-to-digital converter in accordance with claim 1, wherein an optical modulator is arranged ahead of the second input for the input signal that is to be digitised, and wherein the optical modulator modulates an optical input signal based on the input signal that is to be digitised.

3. The optically-based analogue-to-digital converter in accordance with claim 1, wherein an electro-optical modulator is arranged ahead of the second input for the input signal that is to be digitised, wherein the electro-optical modulator modulates an optical input signal based on the input signal that is to be digitised, and wherein the input signal that is to be digitised is an electrical signal.

4. The optically-based analogue-to-digital converter in accordance with claim 3, wherein a first splitter is arranged ahead of the electro-optical modulator, wherein the first splitter splits an optical signal, wherein a first part of the split optical signal is made available to the electro-optical modulator as the optical input signal, and a second part of the split optical signal is fed to the first input of the first combiner as the optical reference signal.

5. The optically-based analogue-to-digital converter in accordance with claim 1, wherein an RF laser is arranged ahead of the second input for the input signal that is to be digitised, wherein the RF laser is controlled based on the input signal that is to be digitised, and wherein the input signal that is to be digitised is an electrical signal.

6. The optically-based analogue-to-digital converter in accordance with claim 1, wherein the optical reference signal is provided by a laser.

7. The optically-based analogue-to-digital converter in accordance with claim 1, wherein a pulse shaper is arranged ahead of the first input for the pulsed laser signal.

8. The optically-based analogue-to-digital converter in accordance with claim 7, wherein input for the pulse shaper is provided by a pulsed laser.

9. The optically-based analogue-to-digital converter in accordance with claim 7, wherein a second splitter is arranged directly ahead of the pulse shaper, wherein a first part of an optical signal split by the second splitter is made available to the pulse shaper, and a second part of the optical signal split by the second splitter is fed to the first input of the first combiner as the optical reference signal via an optical parametric oscillator.

10. The optically-based analogue-to-digital converter in accordance with claim 1, wherein the optically-based analogue-to-digital converter is implemented with discrete components.

11. The optically-based analogue-to-digital converter in accordance with claim 1, wherein the quantum pulse gate is a multi-output quantum pulse gate.

12. The optically-based analogue-to-digital converter in accordance with claim 1, wherein the quantum pulse gate has a poled non-linear waveguide.

13. The optically-based analogue-to-digital converter in accordance with claim 12, wherein the non-linear waveguide is periodically poled.

14. The optically-based analogue-to-digital converter in accordance with claim 12, wherein the non-linear waveguide is aperiodically poled.

15. The optically-based analogue-to-digital converter in accordance with claim 1, wherein the quantum pulse gate has a poled lithium niobate waveguide, and/or a poled potassium titanyl phosphate waveguide.

16. The optically-based analogue-to-digital converter in accordance with claim 1, further comprising the at least one optoelectronic converter.

17. The optically-based analogue-to-digital converter in accordance with claim 1, further comprising a first optical bandpass filter.

18. The optically-based analogue-to-digital converter in accordance with claim 1, wherein the optically-based analogue-to-digital converter is fully integrated.

19. The optically-based analogue-to-digital converter in accordance with claim 1, wherein the optically-based analogue-to-digital converter is at least partially integrated.

*     *     *     *     *